(12) United States Patent
Bang et al.

(10) Patent No.: US 11,605,615 B2
(45) Date of Patent: Mar. 14, 2023

(54) SEMICONDUCTOR PACKAGE AND SEMICONDUCTOR MODULE INCLUDING THE SAME

(71) Applicant: SK hynix Inc., Icheon-si (KR)

(72) Inventors: Byung Jun Bang, Icheon-si (KR); Ju Il Eom, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 35 days.

(21) Appl. No.: 17/398,646

(22) Filed: Aug. 10, 2021

(65) Prior Publication Data

US 2022/0336420 A1    Oct. 20, 2022

(30) Foreign Application Priority Data

Apr. 19, 2021 (KR) .................. 10-2021-0050588

(51) Int. Cl.
*H01L 25/10* (2006.01)
*H01L 25/065* (2006.01)

(52) U.S. Cl.
CPC ........ *H01L 25/0657* (2013.01); *H01L 25/105* (2013.01); *H01L 2225/0651* (2013.01); *H01L 2225/06586* (2013.01)

(58) Field of Classification Search
CPC ............... H01L 25/0657; H01L 25/105; H01L 2225/0651; H01L 2225/06586
See application file for complete search history.

(56) References Cited

FOREIGN PATENT DOCUMENTS

| KR | 101413220 B1 | 6/2014 |
| KR | 1020190082544 A | 7/2019 |

OTHER PUBLICATIONS https://www.google.com/search?q=bond+finger+trace&sxsxsrf=ALeKk02g0LaPxi5v9MBn1I5a_bPj6n0XDA:1607997798680&source=Inms&tbm=isch&sa=X&ved=2ahUKEwi1ztvM8s7tAhUKylsBHUbhAjEQ_AU0AXoECA4QAw&biw=1536&bih=722&dpr=1.25πimgrc=aHvlpwJFa4HIGM.

*Primary Examiner* — Timor Karimy
(74) *Attorney, Agent, or Firm* — William Park & Associates Ltd.

(57) ABSTRACT

A semiconductor package includes: a substrate including a first bonding pad and a first conductive pattern positioned at the same level and in contact with the first bonding pad; a lower semiconductor chip and an upper semiconductor chip stacked over the substrate, the lower and upper semiconductor chips respectively including a first lower chip pad and a first upper chip pad; a first lower bonding wire with first and second ends respectively connected to the first bonding pad and the first lower chip pad; and a first upper bonding wire with a first end connected to the first bonding pad and a second end connected to the first upper chip pad, the first end of the first upper bonding wire is located farther from the lower and upper semiconductor chips and closer to the first conductive pattern than the first end of the first lower bonding wire.

20 Claims, 4 Drawing Sheets

SEMICONDUCTOR PACKAGE AND SEMICONDUCTOR MODULE INCLUDING THE SAME

CROSS-REFERENCE TO RELATED APPLICATION

This application claims priority under 35 U.S.C. § 119 to Korean Patent Application No. 10-2021-0050588 filed on Apr. 19, 2021, which is incorporated herein by reference in its entirety.

BACKGROUND

1. Technical Field

This patent document relates to a semiconductor technology, and more particularly, to a semiconductor package in which a plurality of semiconductor chips are stacked in a vertical direction, and to a semiconductor module including the semiconductor package.

2. Related Art

Electronic products require multifunctional and high-volume data processing while their sizes are getting smaller. Accordingly, there is a growing need to increase the degree of integration of semiconductor devices used in such electronic products.

However, due to the limitation of semiconductor integration technology, it is difficult to satisfy a required function with only a single semiconductor chip, and thus a semiconductor package in which a plurality of semiconductor chips are embedded has been manufactured.

SUMMARY

In an embodiment, a semiconductor package may include: a substrate including a first bonding pad and a first conductive pattern positioned at the same level in a vertical direction as the first bonding pad and in contact with the first bonding pad; a lower semiconductor chip and an upper semiconductor chip that is stacked over the substrate, the lower semiconductor chip including a first lower chip pad and the upper semiconductor chip including a first upper chip pad, wherein the first conductive pattern is positioned farther from the lower semiconductor chip than the first bonding pad; a first lower bonding wire with a first end that is connected to the first bonding pad and a second end that is connected to the first lower chip pad; and a first upper bonding wire with a first end that is connected to the first bonding pad and a second end that is connected to the first upper chip pad, wherein the first end of the first upper bonding wire is located farther from the lower and upper semiconductor chips and closer to the first conductive pattern than the first end of the first lower bonding wire.

In another embodiment, a semiconductor module may include: a module substrate; and first and second semiconductor packages disposed over the module substrate to be spaced apart from each other and electrically connected to each other through the module substrate, wherein the first semiconductor package comprises: a substrate including a first bonding pad and a first conductive pattern positioned at the same level in a vertical direction as the first bonding pad and in contact with the first bonding pad; a lower semiconductor chip and an upper semiconductor chip that is stacked over the substrate, the lower semiconductor chip including a first lower chip pad and the upper semiconductor chip including a first upper chip pad, wherein the first conductive pattern is positioned farther from the lower semiconductor chip than the first bonding pad; a first lower bonding wire with a first end that is connected to the first bonding pad and a second end that is connected to the first lower chip pad; and a first upper bonding wire with a first end that is connected to the first bonding pad and a second end that is connected to the first upper chip pad, and wherein the first end of the first upper bonding wire is located farther from the lower and upper semiconductor chips and closer to the first conductive pattern than the first end of the first lower bonding wire.

DETAILED DESCRIPTION

Figure 1:
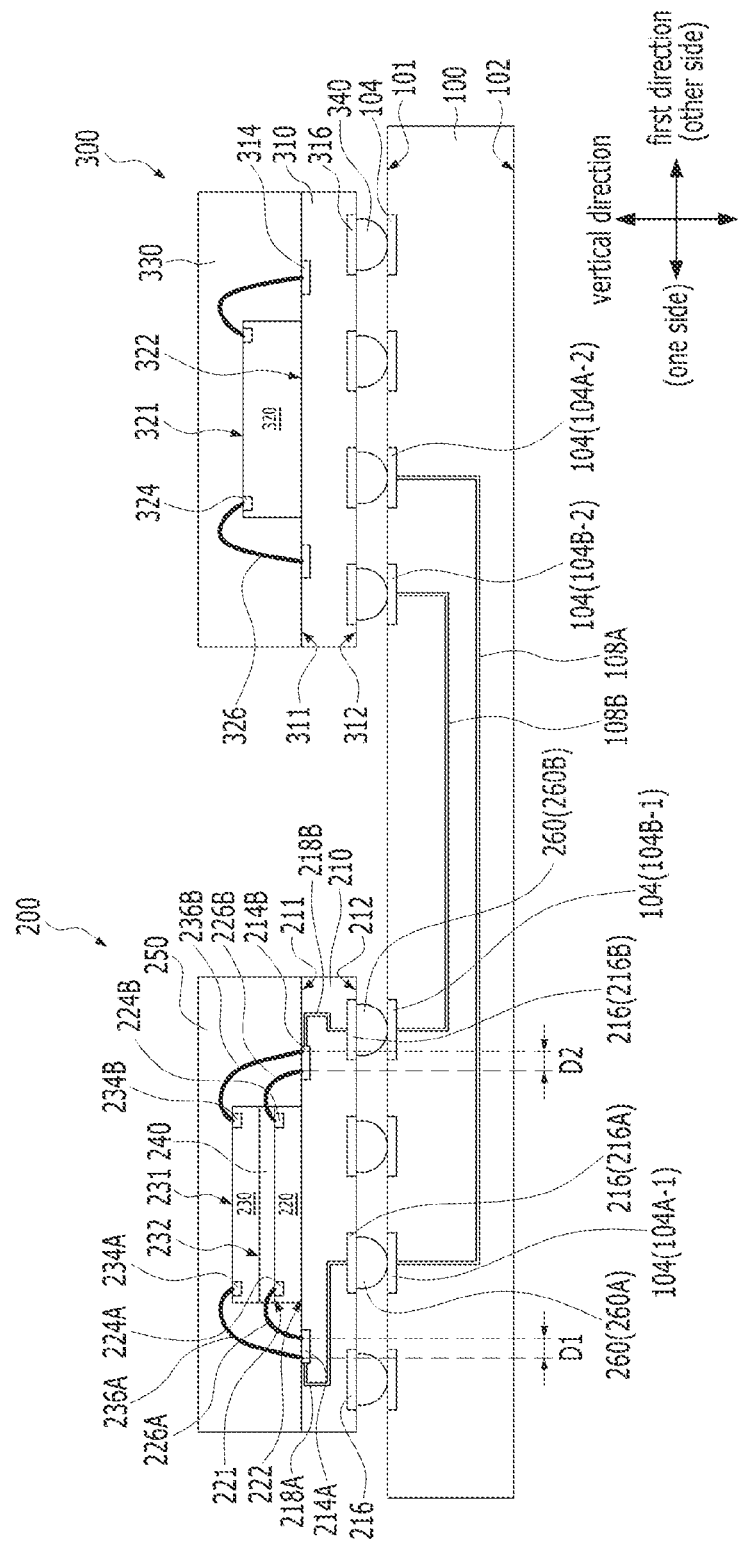
FIG. 1 is a cross-sectional view illustrating a semiconductor module according to an embodiment of the present disclosure.

Hereinafter, various embodiments of the disclosure will be described in detail with reference to the accompanying drawings.

The drawings are not necessarily drawn to scale. In some instances, proportions of at least some structures in the drawings may have been exaggerated in order to clearly illustrate certain features of the described embodiments. In presenting a specific example in a drawing or description with two or more layers in a multi-layer structure, the relative positioning relationship of such layers or the sequence of arranging the layers, as shown, reflects a particular implementation for the described or illustrated example and a different relative positioning relationship or sequence of arranging the layers may be possible. In addition, a described or illustrated example of a multi-layer structure might not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

FIG. 1 is a cross-sectional view illustrating a semiconductor module according to an embodiment of the present disclosure.

Referring to FIG. 1, the semiconductor module of the present embodiment may include a module substrate 100, a first semiconductor package 200, and a second semiconductor package 300.

The module substrate 100 may support the first and second semiconductor packages 200 and 300, and may be for the electrical connection between the first semiconductor package 200 and the second semiconductor package 300, between the first semiconductor package 200 and an external component (not shown), and/or between the second semiconductor package 300 and an external component (not shown). The module substrate 100 may include various wiring structures that are formed in an insulating base. As an example, the module substrate 100 may include a printed circuit board (PCB), a redistribution layer, an interposer, or the like. In the present figures, for convenience of description, only a first wiring structure 108A and a second wiring structure 108B among the wiring structures in the module substrate 100 are illustrated.

The module substrate 100 may include a first surface 101 for mounting the first semiconductor package 200 and the second semiconductor package 300, and a second surface 102 that is disposed to be on the opposite side of the first surface 101. A plurality of substrate pads 104 that are connected to the first semiconductor package 200 and the second semiconductor package 300 may be disposed on the first surface 101 of the module substrate 100. The substrate pad 104 may refer to an electrically conductive element or terminal that is exposed through the first surface 101 of the module substrate 100. The substrate pad 104 may be a part of the wiring structure of the module substrate 100 or may be electrically connected to the wiring structure of the module substrate 100. Among the substrate pads 104, a first substrate pad 104A-1 may be connected to the first wiring structure 108A while being connected to the first semiconductor package 200, a second substrate pad 104B-1 may be connected to the second wiring structure 108B while being connected to the first semiconductor package 200, a third substrate pad 104A-2 may be connected to the first wiring structure 108A while being connected to the second semiconductor package 300, and a fourth substrate pad 104B-2 may be connected to the second wiring structure 108B while being connected to the second semiconductor package 300. Although not shown, a plurality of substrate pads may be disposed on the second surface 102 of the module substrate 100.

Figure 2:
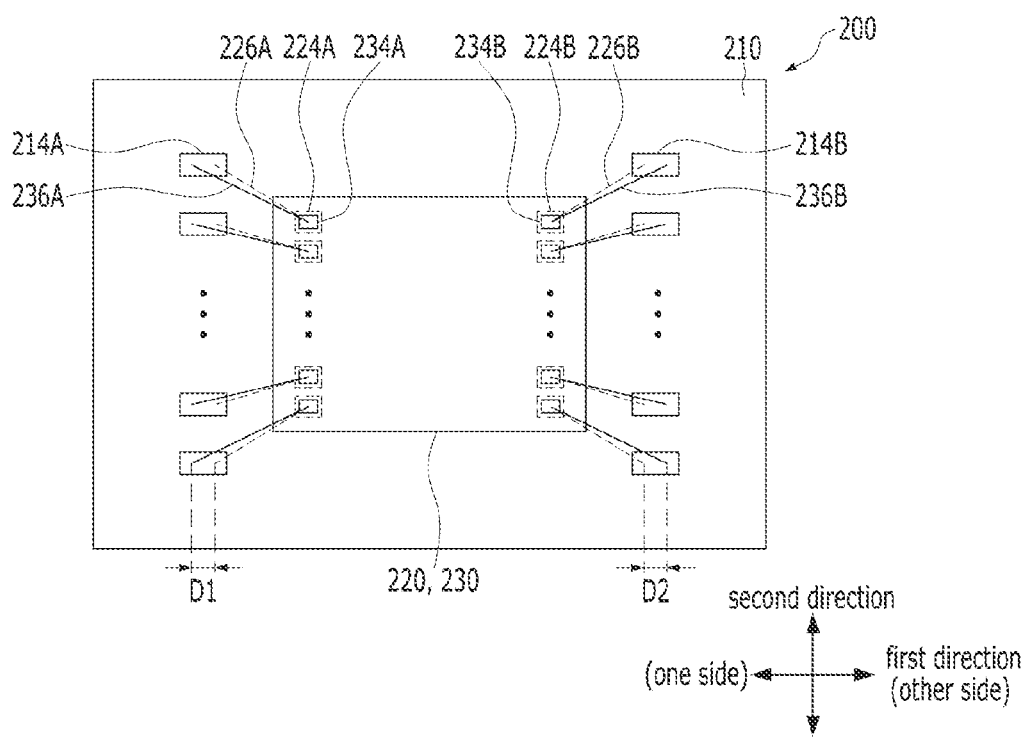
FIG. 2 is a plan view of the first semiconductor package 200 of FIG. 1 viewed from above.

The first semiconductor package 200 may be disposed over the first surface 101 of the module substrate 100 to be spaced apart from the second semiconductor package 300. As an example, the first semiconductor package 200 may be disposed on one side of the second semiconductor package 300 in a first direction (i.e., the horizontal direction). The first semiconductor package 200 may include a substrate 210, a lower semiconductor chip 220, an upper semiconductor chip 230, an adhesive layer 240, a molding layer 250, and a connection electrode 260. In describing the first semiconductor package 200, reference will be made to FIGS. 1 and 2 together. FIG. 2 is a plan view of the first semiconductor package 200 of FIG. 1 viewed from above. When the first semiconductor package 200 is viewed from above, the lower semiconductor chip 220, first and second lower chip pads 224A and 224B of the lower semiconductor chip 220, and portions of first and second lower bonding wires 226A and 226B that are respectively connected to the first and second lower chip pads 224A and 224B may be covered by the upper semiconductor chip 230 and may not be visible. However, for convenience of description, the lower semiconductor chip 220, the first and second lower chip pads 224A and 224B, and the portions of the first and second lower bonding wires 226A and 226B are shown through dotted lines in FIG. 2.

Referring to FIGS. 1 and 2, the substrate 210 may include a first surface 211 for mounting the lower semiconductor chip 220, and a second surface 212 that is positioned opposite to the first surface 211 and is for arranging the connection electrode 260. The substrate 210 may be disposed such that its second surface 212 faces the first surface 101 of the module substrate 100. The substrate 210 may be for the electrical connection between the lower and upper semiconductor chips 220 and 230 and the connection electrode 260 while supporting the lower and upper semiconductor chips 220 and 230. The substrate 210 may include various wiring structures that are formed in an insulating base. As an example, the substrate 210 may include a printed circuit board, a redistribution layer, an interposer, or the like.

A plurality of first bonding pads 214A and a plurality of second bonding pads 214B may be disposed on the first surface 211 of the substrate 210. The first bonding pads 214A may be for the connection with first lower and upper bonding wires 226A and 236A, and the second bonding pads 214B may be for the connection with second lower and upper bonding wires 226B and 236B. The first bonding pad 214A may be for a first channel of the lower and upper semiconductor chips 220 and 230, and the second bonding pad 214B may be for a second channel of the lower and upper semiconductor chips 220 and 230. Here, the channel may mean an independent path for transmitting a signal such as a command or data to a corresponding semiconductor chip. In the present embodiment, each of the lower and upper semiconductor chips 220 and 230 may operate as two independent channels, that is, the first and second channels. The first bonding pad 214A may be disposed on one side of the lower and upper semiconductor chips 220 and 230 in the first direction. For example, the first bonding pad 214A may be disposed in one side edge region of the substrate 210 in the first direction. The second bonding pad 214B may be disposed on the other side of the lower and upper semiconductor chips 220 and 230 in the first direction. For example, the second bonding pad 214B may be disposed in the other side edge region of the substrate 210 in the first direction. For reference, in the figures, one side may correspond to a left side and the other side may correspond to a right side, but the present disclosure is not limited thereto, and it may mean that one side and the other side are located opposite to each other in a horizontal direction. Further, the plurality of first bonding pads 214A may be arranged in a row along a second direction, and the plurality of second bonding pads 214B may be arranged in a row along the second direction. The second direction may be positioned on the same horizontal plane as the first direction while being substantially perpendicular to the first direction. However, the present disclosure is not limited thereto, and positions and arrangements of the first and second bonding pads 214A and 214B may be variously modified.

The first bonding pad 214A may have a bar shape in which a length in the first direction is longer than a length in the second direction or a shape similar thereto. When the first bonding pad 214A is connected in common with ends of corresponding first lower and upper bonding wires 226A and 236A and these ends are arranged in the first direction, this may be to secure a distance between these ends in the first direction. Similarly, the second bonding pad 214B may have a bar shape in which a length in the first direction is longer than a length in the second direction or a shape similar thereto. When the second bonding pad 214B is connected in common with ends of corresponding second lower and upper bonding wires 226B and 236B and these ends are arranged in the first direction, this may be to secure a distance between these ends in the first direction.

In addition, a plurality of electrode pads 216 that are capable of connecting to a plurality of connection electrodes 260 may be disposed on the second surface 212 of the substrate 210. Each of the plurality of electrode pads 216 may be electrically connected to a corresponding first bonding pad 214A or a corresponding second bonding pad 214B through a wiring structure in the substrate 210. Among the plurality of electrode pads 216, a first electrode pad 216A may be electrically connected to one first bonding pad 214A, shown in the cross-sectional view of FIG. 1, and a second electrode pad 216B may be electrically connected to one second bonding pad 214B, shown in the cross-sectional view of FIG. 1. Electrical connection between the first bonding pad 214A and the first electrode pad 216A may be made through the first wiring structure 218A among the wiring structures in the substrate 210, and electrical connection between the second bonding pad 214B and the second electrode pad 216B may be made through the second wiring structure 218B among the wiring structures in the substrate 210. This will be described later.

The lower and upper semiconductor chips 220 and 230 may be stacked over the first surface 211 of the substrate 210 in a vertical direction. In the present embodiment, two semiconductor chips 220 and 230 are stacked over the substrate 210, but the present disclosure is not limited thereto, and the number of semiconductor chips stacked over the substrate 210 may be variously modified in three or more.

The lower and upper semiconductor chips 220 and 230 may have the same planar shape and size. Further, the lower and upper semiconductor chips 220 and 230 may be stacked so that both sidewalls in the first direction are aligned with each other, and both sidewalls in the second direction are aligned with each other. However, the present disclosure is not limited thereto, and the lower and upper semiconductor chips 220 and 230 may have different planar shapes and/or sizes. Alternatively, in the lower and upper semiconductor chips 220 and 230, both sidewalls in the first direction may not be aligned with each other, or both sidewalls in the second direction may not be aligned with each other.

The lower and upper semiconductor chips 220 and 230 may include memory chips. For example, each of the lower and upper semiconductor chips 220 and 230 may include nonvolatile memory such as NAND flash memory, phase-change random-access memory (PRAM), or magnetic random-access memory (MRAM), volatile memory such as dynamic random-access memory (DRAM), mobile DRAM, or static random-access memory (SRAM), and the like. Furthermore, the lower and upper semiconductor chips 220 and 230 may include memory chips of the same type. However, the present disclosure is not limited thereto, and at least one of the lower and upper semiconductor chips 220 and 230 may include a chip with a different function, such as a logic chip.

The lower semiconductor chip 220 may include a first surface 221 on which a plurality of first lower chip pads 224A and a plurality of second lower chip pads 224B are disposed, and a second surface 222 positioned opposite to the first surface 221. The lower semiconductor chip 220 may be disposed such that the second surface 222 faces the first surface 211 of the substrate 210, that is, in a face-up form. The first lower chip pad 224A may be for a first channel of the lower semiconductor chip 220, and the second lower chip pad 224B may be for a second channel of the lower semiconductor chip 220. The first lower chip pad 224A may be disposed in one side edge region of the lower semiconductor chip 220 in the first direction so as to be relatively adjacent to the first bonding pad 214A, and the second lower chip pad 224B may be disposed on the other side edge region of the lower semiconductor chip 220 in the first direction so as to be relatively adjacent to the second bonding pad 214B. Further, the plurality of first lower chip pads 224A may be arranged in a row along the second direction, and the plurality of second lower chip pads 224B may be arranged in a row along the second direction. However, the present disclosure is not limited thereto, and positions and arrangements of the first and second lower chip pads 224A and 224B may be variously modified.

The first lower chip pad 224A may be electrically connected to a corresponding first bonding pad 214A through the first lower bonding wire 226A. The first lower bonding wire 226A may have a first end that is connected to the first bonding pad 214A and a second end that is connected to the first lower chip pad 224A. Similarly, the second lower chip pad 224B may be electrically connected to a corresponding second bonding pad 214B through the second lower bonding wire 226B. The second lower bonding wire 226B may have a first end that is connected to the second bonding pad 214B and a second end that is connected to the second lower chip pad 224B.

The upper semiconductor chip 230 may include a first surface 231 on which a plurality of first upper chip pads 234A and a plurality of second upper chip pads 234B are disposed, and a second surface 232 positioned opposite to the first surface 231. The upper semiconductor chip 230 may be disposed such that the second surface 232 faces the first surface 211 of the substrate 210, that is, in a face-up form. The first upper chip pad 234A may be for a first channel of the upper semiconductor chip 230, and the second upper chip pad 234B may be for a second channel of the upper semiconductor chip 230. The first upper chip pad 234A may be disposed in one side edge region of the upper semiconductor chip 230 in the first direction so as to be relatively adjacent to the first bonding pad 214A, and the second upper chip pad 234B may be disposed in the other side edge region of the upper semiconductor chip 230 in the first direction so as to be relatively adjacent to the second bonding pad 214B. Further, the plurality of first upper chip pads 234A may be arranged in a row along the second direction, and the plurality of second upper chip pads 234B may be arranged in a row along the second direction. Further, the plurality of first upper chip pads 234A may be arranged to overlap with the plurality of first lower chip pads 224A, respectively, and the plurality of second upper chip pads 234B may be arranged to overlap with the plurality of second lower chip pads 224B, respectively. However, the present disclosure is not limited thereto, and positions and arrangements of the first and second upper chip pads 234A and 234B may be variously modified.

The first upper chip pad 234A may be electrically connected to a corresponding first bonding pad 214A through the first upper bonding wire 236A. The first upper bonding wire 236A may have a first end that is connected to the first bonding pad 214A and a second end that is connected to the first upper chip pad 234A. In addition, the second upper chip pad 234B may be electrically connected to a corresponding second bonding pad 214B through the second upper bonding wire 236B. The second upper bonding wire 236B may have a first end that is connected to the second bonding pad 214B and a second end that is connected to the second upper chip pad 234B.

A length of the first lower bonding wire 226A may be shorter than a length of the first upper bonding wire 236A, and the first upper bonding wire 236A may be positioned outside the first lower bonding wire 226A. Accordingly, the first end of the first upper bonding wire 236A may be connected to the first bonding pad 214A at one side of the first end of the first lower bonding wire 226A, that is, at a position farther from the lower and upper semiconductor chips 220 and 230. A distance between the first end of the first upper bonding wire 236A and the first end of the first lower bonding wire 226A will be referred to as a first distance D1. Similarly, a length of the second lower bonding wire 226B may be shorter than a length of the second upper bonding wire 236B, and the second upper bonding wire 236B may be positioned outside the second lower bonding wire 226B. Accordingly, the first end of the second upper bonding wire 236B may be connected to the second bonding pad 214B at the other side of the first end of the second lower bonding wire 226B, that is, at a position farther from the lower and upper semiconductor chips 220 and 230. A distance between the first end of the second upper bonding wire 236B and the first end of the second lower bonding wire 226B will be referred to as a second distance D2.

Referring back to FIG. 1, the adhesive layer 240 may be interposed between the lower semiconductor chip 220 and the upper semiconductor chip 230 to attach the first surface 221 of the lower semiconductor chip 220 and the second surface 232 of the upper semiconductor chip 230 to each other. The adhesive layer 240 may include an insulating adhesive material such as a die attach film (DAF). Here, the adhesive layer 240 may have a thickness sufficiently covering peaks of the first and second lower bonding wires 226A and 226B. That is, in the vertical direction, an upper surface of the adhesive layer 240 may be positioned higher than the peaks of the first and second lower bonding wires 226A and 226B.

The molding layer 250 may be formed over the first surface 211 of the substrate 210 to mold the lower and upper semiconductor chips 220 and 230, the first and second lower bonding wires 226A and 226B, and the first and second upper bonding wires 236A and 236B. The molding layer 250 may include a molding material such as EMC (Epoxy Molding Compound).

The plurality of connection electrodes 260 may be respectively connected to the plurality of electrode pads 216 disposed on the second surface 212 of the substrate 210. The connection electrode 260 may have various shapes such as a column shape, a ball shape, or a combination thereof. In addition, the connection electrode 260 may include various metal materials, solder materials, or a combination thereof. Among the plurality of connection electrodes 260, a first connection electrode 260A may be connected to the first electrode pad 216A, and a second connection electrode 260B may be connected to the second electrode pad 216B.

The second semiconductor package 300 may be disposed over the first surface 101 of the module substrate 100 to be spaced apart from the first semiconductor package 200. As an example, the second semiconductor package 300 may be disposed on the other side of the first semiconductor package 200 in the first direction. The second semiconductor package 300 may include a substrate 310, a semiconductor chip 320, a molding layer 330, and a connection electrode 340.

The substrate 310 may include a first surface 311 for mounting the semiconductor chip 320, and a second surface 312 located opposite to the first surface 311 and for disposing the connection electrode 340. The substrate 310 may be disposed such that its second surface 312 faces the first surface 101 of the module substrate 100. The substrate 310 may be for the electrical connection between the semiconductor chip 320 and the connection electrode 340 while supporting the semiconductor chip 320, and may include various wiring structures that are formed in an insulating base. As an example, the substrate 310 may include a printed circuit board, a redistribution layer, an interposer, and the like.

A plurality of bonding pads 314 that are capable of connecting to a plurality of bonding wires 326 may be disposed on the first surface 311 of the substrate 310. In addition, a plurality of electrode pads 316 that are capable of connecting to the plurality of connection electrodes 340 may be disposed on the second surface 312 of the substrate 310. Electrical connection between the bonding pad 314 and the electrode pad 316 may be made through the wiring structure (not shown) in the substrate 310.

When the lower semiconductor chip 220 and the upper semiconductor chip 230 of the first semiconductor package 200 include memory chips, the semiconductor chip 320 may include a logic chip for controlling operations of the lower semiconductor chip 220 and the upper semiconductor chip 230. As an example, the semiconductor chip 320 may perform an operation of providing data read from the lower semiconductor chip 220 and the upper semiconductor chip 230 to a host (not shown), or storing data provided from the host to the lower semiconductor chip 220 and the upper semiconductor chip 230. As an example, the semiconductor chip 320 may be implemented as a system-on-chip (SOC) including a central processing unit (CPU), a graphics processing unit (GPU), an application processor (AP), a microprocessor, a digital signal processor (DSP), and/or a controller.

The semiconductor chip 320 may include a first surface 321 on which a plurality of chip pads 324 are disposed, and a second surface 322 that is disposed to be on the opposite side of the first surface 321. The semiconductor chip 320 may be disposed such that the second surface 322 faces the first surface 311 of the substrate 310, that is, in a face-up form. The chip pads 324 may be disposed in both edge regions of the semiconductor chip 320 in the first direction. However, the present disclosure is not limited thereto, and arrangements of the chip pads 324 in the semiconductor chip 320 may be variously modified. The chip pad 324 and the bonding pad 314 may be connected to each other through the bonding wire 326.

The molding layer 330 may be formed over the first surface 311 of the substrate 310 to mold the semiconductor chip 320 and the bonding wire 326.

The plurality of connection electrodes 340 may be connected to the plurality of electrode pads 316 disposed on the second surface 312 of the substrate 310, respectively. The connection electrode 340 may have various shapes such as a column shape, a ball shape, or a combination thereof. In addition, the connection electrode 340 may include various metal materials, solder materials, or a combination thereof.

In the semiconductor module described above, an electrical connection path for signal transmission between the lower and upper semiconductor chips 220 and 230 of the first semiconductor package 200 and the semiconductor chip 320 of the second semiconductor package 300 may be formed. Through this electrical connection path, a signal from the semiconductor chip 320 of the second semiconductor package 300, such as a data signal or a data address signal, may be transferred to the lower and upper semiconductor chips 220 and 230 of the first semiconductor package 200. Alternatively, through this electrical connection path, a signal from the lower and upper semiconductor chips 220 and 230 of the first semiconductor package 200, such as a data signal, may be transferred to the semiconductor chip 320 of the second semiconductor package 300.

In particular, a first signal may be received from the semiconductor chip 320 of the second semiconductor package 300 to the first channel of the lower and upper semiconductor chips 220 and 230 of the first semiconductor package 200, by a following path. First, in the second semiconductor package 300, the first signal of the semiconductor chip 320 may be transmitted through one chip pad 324, the bonding wire 326 that is connected thereto, the bonding pad 314 that is connected thereto, the electrode pad 316 that is connected thereto through the wiring structure (not shown) in the substrate 310, and the connection electrode 340 that is connected thereto. In the module substrate 100, the first signal may be transmitted through the third substrate pad 104A-2 connected to the connection electrode 340, the first wiring structure 108A that is connected thereto, and the first substrate pad 104A-1 that is connected thereto. Further, in the first semiconductor package 200, the first signal may be transmitted through the first connection electrode 260A connected to the first substrate pad 104A-1, the first electrode pad 216A that is connected thereto, the first bonding pad 214A that is connected thereto through the first wiring structure 218A, the first lower and upper bonding wires 226A and 236A that are connected thereto, and the first lower and upper chip pads 224A and 234A that are connected thereto.

In addition, a second signal may be received from the semiconductor chip 320 of the second semiconductor package 300 to the second channel of the lower and upper semiconductor chips 220 and 230 of the first semiconductor package 200, by a following path. First, in the second semiconductor package 300, the second signal of the semiconductor chip 320 may be transmitted through another chip pad 324 different from the one chip pad 324 to which the first signal is input, the bonding wire 326 that is connected thereto, the bonding pad 314 that is connected thereto, the electrode pad 316 that is connected thereto through the wiring structure (not shown) in the substrate 310, and the connection electrode 340 that is connected thereto. In the module substrate 100, the second signal may be transmitted through the fourth substrate pad 104B-2 connected to the connection electrode 340, the second wiring structure 108B that is connected thereto, and the second substrate pad 104B-1 that is connected thereto. Further, in the first semiconductor package 200, the second signal may be transmitted through the second connection electrode 260B connected to the second substrate pad 104B-1, the second electrode pad 216B that is connected thereto, the second bonding pad 214B that is connected thereto through the second wiring structure 218B, the second lower and upper bonding wires 226B and 236B that are connected thereto, and the second lower and upper chip pads 224B and 234B that are connected thereto.

Here, because the second semiconductor package 300 is located at the other side of the first semiconductor package 200 in the first direction, a signal transmission direction from the second semiconductor package 300 to the first semiconductor package 200, in particular, a signal transmission direction from the connection electrode 340 of the second semiconductor package 300 to the connection electrode 260 of the first semiconductor package 200 may be from the other side to one side. The signal transmission direction from the second semiconductor package 300 to the first semiconductor package 200 will hereinafter be referred to as a main signal transmission direction.

Figure 3:
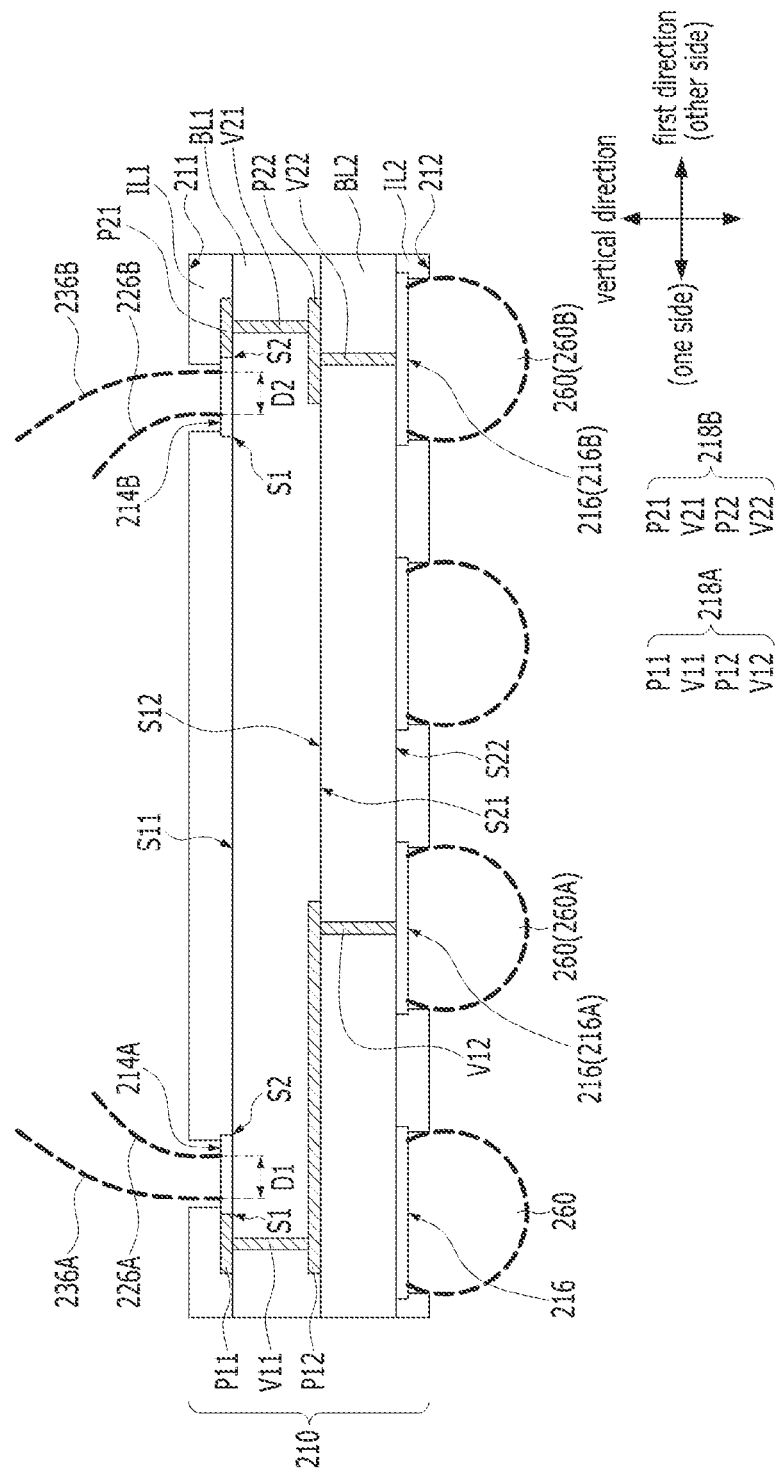
FIG. 3 is a cross-sectional view illustrating an example of the substrate 210 of the first semiconductor package 200 of FIG. 1.

On the other hand, signal transmission in the substrate 210 of the first semiconductor package 200 may be performed in a direction that is different from the main signal transmission direction. This will be exemplarily described with reference to FIGS. 1 and 3 together. FIG. 3 is a cross-sectional view illustrating an example of the substrate 210 of the first semiconductor package 200 of FIG. 1. For convenience of description, in FIG. 3, the first lower and upper bonding wires 226A and 236A, the second lower and upper bonding wires 226B and 236B, and the connection electrodes 260 including the first and second connection electrodes 260A and 260B are shown through dotted lines.

Referring to FIGS. 1 and 3, the substrate 210 may further include upper and lower base layers BL1 and BL2, upper and lower insulating layers IL1 and IL2, first upper and lower conductive patterns P11 and P12, first upper and lower conductive vias V11 and V12, second upper and lower conductive patterns P21 and P22, and second upper and lower conductive vias V21 and V22, in addition to the first and second bonding pads 214A and 214B and the electrode pads 216 including the first and second electrode pads 216A and 216B, described above.

The upper base layer BL1 may include a first surface S11 on which the first and second bonding pads 214A and 214B, the first and second upper conductive patterns P11 and P21, and the upper insulating layer IL1 are formed, and a second surface S12 that is disposed to be on the opposite side of the first surface S11 and facing a first surface S21 of the lower base layer BL2. The lower base layer BL2 may include the first surface S21, and a second surface S22 that is disposed to be on the opposite side of the first surface S21 and on which the electrode pad 216 and the second insulating layer IL2 are formed. The upper and lower base layers BL1 and BL2 may be formed of various insulating materials. When the substrate 210 is a printed circuit board, the upper and lower base layers BL1 and BL2 may form a body or core of the printed circuit board, and may include a material such as epoxy resin or polyimide.

The upper insulating layer IL1 may cover the first surface S11 of the upper base layer BL1 while with an opening exposing each of the first and second bonding pads 214A and 214B. Through this opening, a part or a whole of the first bonding pad 214A may be exposed, and a part or a whole of the second bonding pad 214B may be exposed. The lower insulating layer IL2 may cover the second surface S22 of the lower base layer BL2 while with an opening exposing each of the electrode pads 216. Through this opening, a part or a whole of the electrode pad 216 may be exposed. The upper and lower insulating layers IL1 and IL2 may include various insulating materials such as solder resist.

The first and second upper conductive patterns P11 and P21 may be formed over the first surface S11 of the upper base layer BL1, and thus the first and second upper conductive patterns P11 and P21 may be located at the same level as the first and second bonding pads 214A and 214B in the vertical direction. In addition, the first and second upper conductive patterns P11 and P21 may contact sidewalls of the first and second bonding pads 214A and 214B, respectively, and thus, the first and second upper conductive patterns P11 and P21 may be electrically connected to the first and second bonding pads 214A and 214B, respectively. In this case, the first upper conductive pattern P11 may be arranged to be in contact with a first sidewall S1 positioned at one side of the first bonding pad 214A, among the first and second sidewalls S1 and S2 respectively positioned at both sides of the first bonding pad 214A in the first direction. In addition, the second upper conductive pattern P21 may be arranged to be in contact with a second sidewall S2 positioned at the other side of the second bonding pad 214B, among the first and second sidewalls S1 and S2 respectively positioned at both sides of the second bonding pad 214B in the first direction. The first and second upper conductive patterns P11 and P21 may not be exposed on a surface of the substrate 210 by being covered by the upper insulating layer IL1.

The first and second upper conductive vias V11 and V21 may be disposed under and connected to the first and second upper conductive patterns P11 and P21, respectively, while passing through the upper base layer BL1 and extending vertically downward.

The first and second lower conductive vias V12 and V22 may be disposed over and connected to the first and second electrode pads 216A and 216B, respectively, while passing through the lower base layer BL2 and extending vertically upward.

The first and second lower conductive patterns P12 and P22 may be formed over the first surface S12 of the lower base layer BL2. However, the present disclosure is not limited thereto, and the first and second lower conductive patterns P12 and P22 may be formed over the second surface S12 of the upper base layer BL1. The first lower conductive pattern P12 may serve to connect the first upper conductive via V11 and the first lower conductive via V12 to each other. To this end, the first lower conductive pattern P12 may overlap and connect with a lower end of the first upper conductive via V11 and an upper end of the first lower conductive via V12, while with a shape extending in the horizontal direction between the first upper conductive via V11 and the first lower conductive via V12. The second lower conductive pattern P22 may serve to connect the second upper conductive via V21 and the second lower conductive via V22 to each other. To this end, the second lower conductive pattern P22 may overlap and connect with a lower end of the second upper conductive via V21 and an upper end of the second lower conductive via V22, while with a shape extending in the horizontal direction between the second upper conductive via V21 and the second lower conductive via V22.

The first upper conductive pattern P11, the first upper conductive via V11, the first lower conductive pattern P12, and the first lower conductive via V12 may form the aforementioned first wiring structure 218A. In addition, the second upper conductive pattern P21, the second upper conductive via V21, the second lower conductive pattern P22, and the second lower conductive via V22 may form the aforementioned second wiring structure 218B.

In the first and second wiring structures 218A and 218B, the first bonding pad 214A may receive a signal from the first upper conductive pattern P11 disposed on one side in the first direction. That is, because a direction of the signal that is received based on the first bonding pad 214A is from one side to the other side in the first direction, it may be opposite to the main signal transmission direction described above. On the other hand, the second bonding pad 214B may receive a signal from the second upper conductive pattern P21 disposed on the other side in the first direction. That is, because a direction of the signal that is received based on the second bonding pad 214B is from the other side to one side in the first direction, it may coincide with the main signal transmission direction described above. The effect of this will be described in comparison with a comparative example as follows.

A semiconductor package of the comparative example includes a lower semiconductor chip and an upper semiconductor chip stacked in a vertical direction. Here, the lower semiconductor chip receives a signal through a lower bonding wire with a relatively short length by connecting a predetermined bonding pad and a lower chip pad, and the upper semiconductor chip receives a signal through an upper bonding wire with a relatively long length by connecting the predetermined bonding pad and an upper chip pad. In this comparative example, signal distortion may occur due to a difference in length between the lower bonding wire and the upper bonding wire. This is because the signal reflected from the end of the upper bonding wire with a relatively long length causes signal distortion.

In the present embodiment, it may be similar to the comparative example in that the lower and upper semiconductor chips 220 and 230 respectively connected to the first lower bonding wire 226A with a relatively short length and the first upper bonding wire 236A with a relatively long length receive signals. However, because the first upper conductive pattern P11 is disposed on one side of the first bonding pad 214A, the signal that is received to the first bonding pad 214A reaches the first end of the first upper bonding wire 236A first, and then, passes through the first distance D1 and reaches the first end of the first lower bonding wire 226A later. That is, when the length of the first lower bonding wire 226A is L11 and the length of the first upper bonding wire 236A is L12, the effect of the difference between these lengths may be reduced by the first distance D1. The first distance D1 may be controlled substantially the same as or similar to L12-L11. For example, the first distance D1 may have a value that is greater than or equal to (L12-L11)*0.9 and less than or equal to (L12-L11)*1.1. As a result, signal distortion due to the difference in length between the first lower bonding wire 226A and the first upper bonding wire 236A may be reduced or prevented.

As long as the first upper conductive pattern P11 is disposed on one side of the first bonding pad 214A, that is, adjacent to the first end of the first upper bonding wire 236A, a shape of the rest of the first wiring structure 218A, that is, a shape of a structure formed by the first upper conductive via V11, the first lower conductive pattern P12, and the first lower conductive via V12 may be variously modified on the assumption that the structure connects the first upper conductive pattern P11 and the first electrode pad 216A to each other. For example, as shown, when the first electrode pad 216A is located below the other side of the first bonding pad 214A, the rest of the first wiring structure 218A may have a bent shape in the vertical and horizontal directions toward the first electrode pad 216A.

Similarly, the lower and upper semiconductor chips 220 and 230 respectively connected to the second lower bonding wire 226B with a relatively short length and the second upper bonding wire 236B with a relatively long length may receive signals. Because the second upper conductive pattern P21 is disposed on the other side of the second bonding pad 214B, the signal that is received to the second bonding pad 214B reaches the first end of the second upper bonding wire 236B first, and then, passes through the second distance D2 and reaches the first end of the second lower bonding wire 226B later. That is, when the length of the second lower bonding wire 226B is L21 and the length of the second upper bonding wire 236B is L22, the effect of the difference between these lengths may be reduced by the second distance D2. The second distance D2 may be controlled substantially the same as or similar to L22-L21. For example, the second distance D2 may have a value that is greater than or equal to (L22-L21)*0.9 and less than or equal to (L22-L21)*1.1. As a result, signal distortion due to the difference in length between the second lower bonding wire 226B and the second upper bonding wire 236B may be reduced or prevented.

As long as the second upper conductive pattern P21 is disposed on the other side of the second bonding pad 214B, that is, adjacent to the first end of the second upper bonding wire 236B, a shape of the rest of the second wiring structure 218B, that is, a shape of a structure formed by the second upper conductive via V21, the second lower conductive pattern P22, and the second lower conductive via V22 may be variously modified on the assumption that the structure connects the second upper conductive pattern P21 and the second electrode pad 216B to each other. For example, as shown, when the second electrode pad 216B is located below the other side of the second bonding pad 214B, the rest of the second wiring structure 218B may have a bent shape in the vertical and horizontal directions toward the second electrode pad 216B.

As a result, when the signal is transmitted from the second semiconductor package 300 to the lower and upper semiconductor chips 220 and 230 of the first semiconductor package 200, signal distortion due to the difference in length of the lower bonding wires 226A and 226B connected to the lower semiconductor chip 220 and the upper bonding wires 236A and 236B connected to the upper semiconductor chip 230 may be reduced/prevented. In particular, even if the lower and upper semiconductor chips 220 and 230 are driven with the first channel and the second channel with different distances from the second semiconductor package 300, signal distortion may be reduced/prevented.

According to the above embodiments of the present disclosure, it may be possible to provide a semiconductor package that is capable of reducing signal distortion while satisfying the demand for high performance/high capacity and a semiconductor module including the same.

Figure 4:
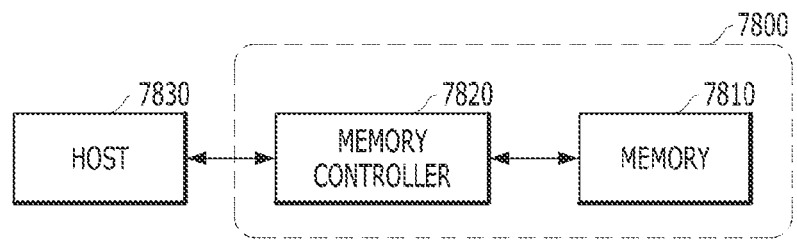
FIG. 4 shows a block diagram illustrating an electronic system employing a memory card including a semiconductor package, according to an embodiment.

FIG. 4 shows a block diagram illustrating an electronic system including a memory card 7800 employing at least one of the semiconductor packages according to the embodiments. The memory card 7800 includes a memory 7810, such as a nonvolatile memory device, and a memory controller 7820. The memory 7810 and the memory controller 7820 may store data or read out the stored data. At least one of the memory 7810 and the memory controller 7820 may include at least one of the semiconductor packages according to described embodiments.

The memory 7810 may include a nonvolatile memory device to which the technology of the embodiments of the present disclosure is applied. The memory controller 7820 may control the memory 7810 such that stored data is read out or data is stored in response to a read/write request from a host 7830.

Figure 5:
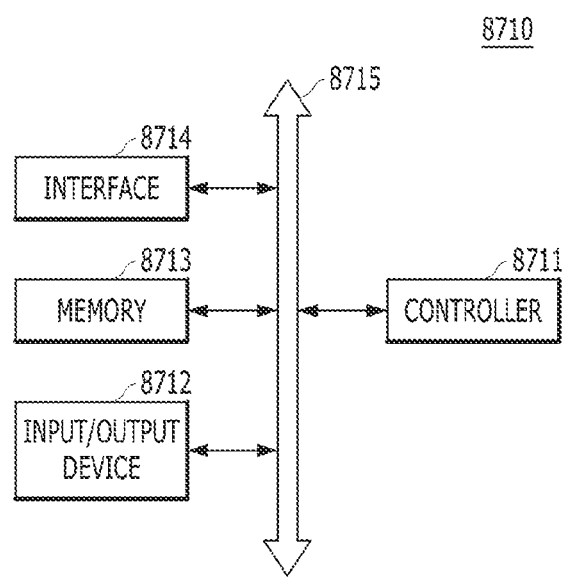
FIG. 5 shows a block diagram illustrating another electronic system including a semiconductor package, according to an embodiment.

FIG. 5 shows a block diagram illustrating an electronic system 8710 including at least one of the semiconductor packages according to described embodiments. The electronic system 8710 may include a controller 8711, an input/output device 8712, and a memory 8713. The controller 8711, the input/output device 8712, and the memory 8713 may be coupled with one another through a bus 8715 providing a path through which data move.

In an embodiment, the controller 8711 may include one or more microprocessor, digital signal processor, microcontroller, and/or logic device capable of performing the same functions as these components. The controller 8711 or the memory 8713 may include one or more of the semiconductor packages according to the embodiments of the present disclosure. The input/output device 8712 may include at least one selected among a keypad, a keyboard, a display device, a touchscreen and so forth. The memory 8713 is a device for storing data. The memory 8713 may store data and/or commands to be executed by the controller 8711, and the like.

The memory 8713 may include a volatile memory device such as a DRAM and/or a nonvolatile memory device such as a flash memory. For example, a flash memory may be mounted to an information processing system such as a mobile terminal or a desktop computer. The flash memory may constitute a solid state disk (SSD). In this case, the electronic system 8710 may stably store a large amount of data in a flash memory system.

The electronic system 8710 may further include an interface 8714 configured to transmit and receive data to and from a communication network. The interface 8714 may be a wired or wireless type. For example, the interface 8714 may include an antenna or a wired or wireless transceiver.

The electronic system 8710 may be realized as a mobile system, a personal computer, an industrial computer, or a logic system performing various functions. For example, the mobile system may be any one of a personal digital assistant (PDA), a portable computer, a tablet computer, a mobile phone, a smart phone, a wireless phone, a laptop computer, a memory card, a digital music system, and an information transmission/reception system.

If the electronic system 8710 represents equipment capable of performing wireless communication, the electronic system 8710 may be used in a communication system using a technique of CDMA (code division multiple access), GSM (global system for mobile communications), NADC (north American digital cellular), E-TDMA (enhanced-time division multiple access), WCDMA (wideband code division multiple access), CDMA2000, LTE (long term evolution), or Wibro (wireless broadband Internet).

Although various embodiments have been described for illustrative purposes, it will be apparent to those skilled in the art that various changes and modifications may be made without departing from the spirit and scope of the present teachings as defined in the following claims.

What is claimed is:

1. A semiconductor package comprising:
   a substrate including a first bonding pad and a first conductive pattern positioned at the same level in a vertical direction as the first bonding pad and in contact with the first bonding pad;
   a lower semiconductor chip and an upper semiconductor chip that is stacked over the substrate, the lower semiconductor chip including a first lower chip pad and the upper semiconductor chip including a first upper chip pad, wherein the first conductive pattern is positioned farther from the lower semiconductor chip than the first bonding pad;
   a first lower bonding wire with a first end that is connected to the first bonding pad and a second end that is connected to the first lower chip pad; and
   a first upper bonding wire with a first end that is connected to the first bonding pad and a second end that is connected to the first upper chip pad,
   wherein the first end of the first upper bonding wire is located farther from the lower and upper semiconductor chips and closer to the first conductive pattern than the first end of the first lower bonding wire.

2. The semiconductor package according to claim 1, wherein a length of the first upper bonding wire is longer than a length of the first lower bonding wire.

3. The semiconductor package according to claim 2, wherein a value that is obtained by subtracting the length of the first lower bonding wire from the length of the first upper bonding wire has a value that is greater than or equal to 0.9 times and less than or equal to 1.1 times a distance between the first end of the first upper bonding wire and the first end of the first lower bonding wire.

4. The semiconductor package according to claim 1, wherein the substrate further includes a second bonding pad and a second conductive pattern that are positioned at the same level as the second bonding pad in the vertical direction, the second conductive pattern being in contact with the second bonding pad,
wherein the lower semiconductor chip further includes a second lower chip pad, and
wherein the upper semiconductor chip further includes a second upper chip pad,
the semiconductor package further comprising:
a second lower bonding wire with a first end that is connected to the second bonding pad and a second end that is connected to the second lower chip pad; and
a second upper bonding wire with a first end that is connected to the second bonding pad and a second end that is connected to the second upper chip pad,
wherein the first end of the second upper bonding wire is located farther from the lower and upper semiconductor chips and closer to the second conductive pattern than the first end of the second lower bonding wire.

5. The semiconductor package according to claim 4, wherein a length of the second upper bonding wire is longer than a length of the second lower bonding wire.

6. The semiconductor package according to claim 5, wherein a value obtained by subtracting the length of the second lower bonding wire from the length of the second upper bonding wire has a value that is greater than or equal to 0.9 times and less than or equal to 1.1 times a distance between the first end of the second upper bonding wire and the first end of the second lower bonding wire.

7. The semiconductor package according to claim 4, wherein the first bonding pad is disposed on one side of the lower and upper semiconductor chips,
wherein the second bonding pad is disposed on an other side of the lower and upper semiconductor chips,
wherein the first conductive pattern is in contact with the first bonding pad at one side, and
wherein the second conductive pattern is in contact with the second bonding pad at on other side.

8. The semiconductor package according to claim 7, wherein the first lower chip pad and the second lower chip pad are respectively disposed on one side edge and an other side edge of the lower semiconductor chip, and
wherein the first upper chip pad and the second upper chip pad are respectively disposed on one side edge and an other side edge of the upper semiconductor chip.

9. The semiconductor package according to claim 7, wherein a direction of a signal that is received in the semiconductor package is different from a signal transmission direction in the first conductive pattern and is the same as a signal transmission direction in the second conductive pattern.

10. A semiconductor module comprising:
a module substrate; and
first and second semiconductor packages disposed over the module substrate to be spaced apart from each other and electrically connected to each other through the module substrate,
wherein the first semiconductor package comprises:
a substrate including a first bonding pad and a first conductive pattern positioned at the same level in a vertical direction as the first bonding pad and in contact with the first bonding pad;
a lower semiconductor chip and an upper semiconductor chip that is stacked over the substrate, the lower semiconductor chip including a first lower chip pad and the upper semiconductor chip including a first upper chip pad, wherein the first conductive pattern is positioned farther from the lower semiconductor chip than the first bonding pad;
a first lower bonding wire with a first end that is connected to the first bonding pad and a second end that is connected to the first lower chip pad; and
a first upper bonding wire with a first end that is connected to the first bonding pad and a second end that is connected to the first upper chip pad, and
wherein the first end of the first upper bonding wire is located farther from the lower and upper semiconductor chips and closer to the first conductive pattern than the first end of the first lower bonding wire.

11. The semiconductor module according to claim 10, wherein a length of the first upper bonding wire is longer than a length of the first lower bonding wire.

12. The semiconductor module according to claim 11, wherein a value obtained by subtracting the length of the first lower bonding wire from the length of the first upper bonding wire has a value that is greater than or equal to 0.9 times and less than or equal to 1.1 times a distance between the first end of the first upper bonding wire and the first end of the first lower bonding wire.

13. The semiconductor module according to claim 10, wherein the substrate further includes a second bonding pad and a second conductive pattern positioned at the same level as the second bonding pad in the vertical direction, the second conductive pattern being in contact with the second bonding pad,
wherein the lower semiconductor chip further includes a second lower chip pad,
wherein the upper semiconductor chip further includes a second upper chip pad,
wherein the first semiconductor package further comprises:
a second lower bonding wire with a first end that is connected to the second bonding pad and a second end that is connected to the second lower chip pad; and
a second upper bonding wire with a first end that is connected to the second bonding pad and a second end that is connected to the second upper chip pad, and
wherein the first end of the second upper bonding wire is located farther from the lower and upper semiconductor chips and closer to the second conductive pattern than the first end of the second lower bonding wire.

14. The semiconductor module according to claim 13, wherein a length of the second upper bonding wire is longer than a length of the second lower bonding wire.

15. The semiconductor module according to claim 14, wherein a value obtained by subtracting the length of the second lower bonding wire from the length of the second upper bonding wire has a value that is greater than or equal to 0.9 times and less than or equal to 1.1 times a distance between the first end of the second upper bonding wire and the first end of the second lower bonding wire.

16. The semiconductor module according to claim 13, wherein the first bonding pad is disposed on one side of the lower and upper semiconductor chips, wherein the second bonding pad is disposed on an other side of the lower and upper semiconductor chips,
wherein the first conductive pattern is in contact with the first bonding pad at one side, and
wherein the second conductive pattern is in contact with the second bonding pad at an other side.

17. The semiconductor module according to claim 16, wherein the first lower chip pad and the second lower chip pad are respectively disposed on one side edge and an other side edge of the lower semiconductor chip, and
wherein the first upper chip pad and the second upper chip pad are respectively disposed on one side edge and an other side edge of the upper semiconductor chip.

18. The semiconductor module according to claim 10, wherein the first semiconductor package is disposed on one side of the second semiconductor package, and receives a signal from the second semiconductor package through the module substrate,
wherein the first bonding pad is disposed on one side of the lower and upper semiconductor chips,
wherein the first conductive pattern is in contact with the first bonding pad at one side, and
wherein a signal transmission direction in the module substrate is different from a signal transmission direction in the first conductive pattern.

19. The semiconductor module according to claim 13, wherein the first semiconductor package is disposed on one side of the second semiconductor package, and receives a signal from the second semiconductor package through the module substrate,
wherein the first bonding pad is disposed on one side of the lower and upper semiconductor chips,
wherein the first conductive pattern is in contact with the first bonding pad at one side,
wherein the second bonding pad is disposed on an other side of the lower and upper semiconductor chips,
wherein the second conductive pattern is in contact with the second bonding pad at an other side, and
wherein a signal transmission direction in the module substrate is different from a signal transmission direction in the first conductive pattern, and is the same as a signal transmission direction in the second conductive pattern.

20. The semiconductor module according to claim 10, wherein the lower and upper semiconductor chips include memory chips, and
wherein the second semiconductor package includes a logic chip for controlling the memory chips.

* * * * *